United States Patent
Nakazawa et al.

(10) Patent No.: US 10,021,812 B2
(45) Date of Patent: Jul. 10, 2018

(54) RADIO DEVICE WITH HEAT SINK

(71) Applicant: FUJITSU LIMITED, Kawasaki-shi, Kanagawa (JP)

(72) Inventors: Hitoshi Nakazawa, Kawasaki (JP); Hiroyuki Miura, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 48 days.

(21) Appl. No.: 14/975,031

(22) Filed: Dec. 18, 2015

(65) Prior Publication Data

US 2016/0192441 A1 Jun. 30, 2016

(30) Foreign Application Priority Data

Dec. 26, 2014 (JP) ................................. 2014-264953

(51) Int. Cl.
*H05K 7/20* (2006.01)

(52) U.S. Cl.
CPC ............................... *H05K 7/20409* (2013.01)

(58) Field of Classification Search
CPC .......................... H05K 7/20409; H01Q 1/246
USPC ................................................ 455/560–561
See application file for complete search history.

(56) References Cited

U.S. PATENT DOCUMENTS

| 2006/0286959 | A1* | 12/2006 | Knecht ..................... H04B 1/18 455/349 |
| 2013/0329356 | A1* | 12/2013 | Shanbhogue .......... H05K 1/144 361/679.47 |
| 2015/0031415 | A1* | 1/2015 | Liu .......................... H01L 23/38 455/561 |
| 2016/0197660 | A1* | 7/2016 | O'Keeffe et al. ...... H01Q 1/246 370/329 |
| 2016/0261030 | A1* | 9/2016 | Kim ....................... H01Q 1/246 |

FOREIGN PATENT DOCUMENTS

| JP | 2008-112870 A | 5/2008 |
| JP | 2011-155049 A | 8/2011 |
| JP | 2011-181880 A | 9/2011 |

* cited by examiner

*Primary Examiner* — Michael Mapa
(74) *Attorney, Agent, or Firm* — Arent Fox LLP (57) ABSTRACT

A radio device including: a housing, a heat sink provided on an external surface of the housing, the heat sink extending in a vertical direction of the housing, a board accommodated inside the housing in the vertical direction, the board being coupled to the heat sink through the housing, the board including a first area and a second area, the first area being located above the second area in the vertical direction, and a plurality of electronic components provided on the board, the plurality of electronic components including at least one first electronic component and at least one second electronic component, the at least one first electronic component being more heat-resistant than the at least one second electronic component, the at least one first electronic component being provided on the first area, the at least one second electronic component being provided on the second area.

11 Claims, 10 Drawing Sheets

RADIO DEVICE WITH HEAT SINK

CROSS-REFERENCE TO RELATED APPLICATION

This application is based upon and claims the benefit of priority of the prior Japanese Patent Application No. 2014-264953, filed on Dec. 26, 2014, the entire contents of which are incorporated herein by reference.

FIELD

The exemplary embodiments discussed herein are related to a radio device.

BACKGROUND

There are radio devices that includes a housing, electronic components that are accommodated in the housing, and a radiation member that is provided on an external surface of the housing and that radiates heat, which has been generated by the electronic components, to the outside of the housing (see Japanese Laid-open Patent Publication No. 2008-112870, Japanese Laid-open Patent Publication No. 2011-181880, and Japanese Laid-open Patent Publication No. 2011-155049, for example).

SUMMARY

According to an aspect of the invention, a radio device includes a housing, a heat sink provided on an external surface of the housing, the heat sink extending in a vertical direction of the housing, a board accommodated inside the housing in the vertical direction, the board being coupled to the heat sink through the housing, the board including a first area and a second area, the first area being located above the second area in the vertical direction, and a plurality of electronic components provided on the board, the plurality of electronic components including at least one first electronic component and at least one second electronic component, the at least one first electronic component being more heat-resistant than the at least one second electronic component, the at least one first electronic component being provided on the first area of the board, the at least one second electronic component being provided on the second area of the board.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

The above type of radio device has room to further improve its efficiency of radiation of heat, which the electronic components have generated, to the outside of the housing.

An object of the technique disclosed in the present application is, in one aspect, to increase the efficiency of radiation of heat, which an electronic component has generated, to the outside of the housing.

A first exemplary embodiment of the technology disclosed in the present application will be described first.

Figure 1:
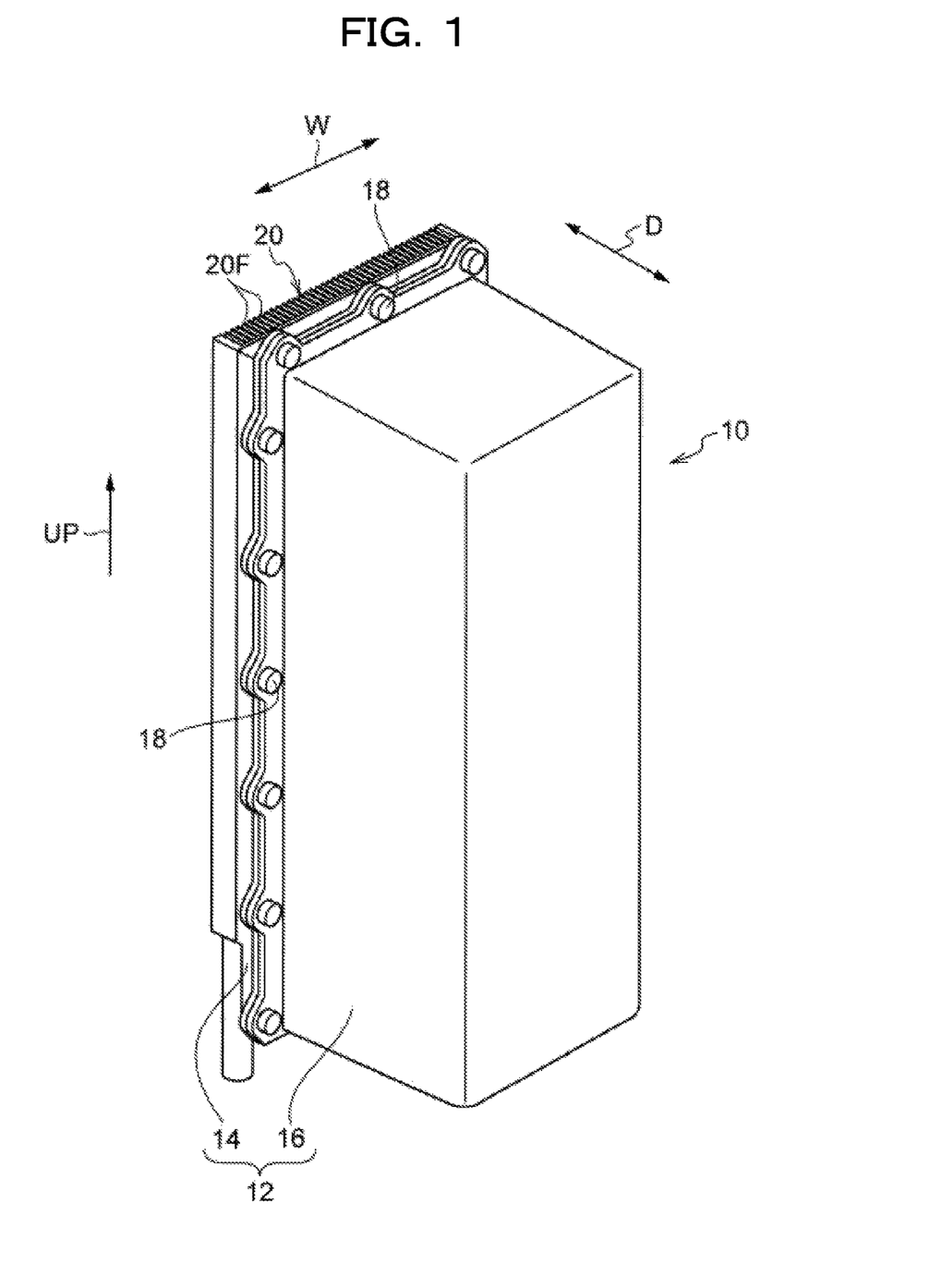
FIG. 1 is a perspective view illustrating a radio device according to a first exemplary embodiment.

As illustrated in FIG. 1, a radio device 10 according to the present exemplary embodiment is an optical extension device (a wireless unit) such as a remote radio head (RRH) or a piece of remote radio equipment (RRE) that constitutes a portion of a radio base station of a portable terminal or the like. A radio control device (a radio control unit) such as a base band unit (BBU, not shown) is connected to the radio device 10 through an optical cable 42 described later. Furthermore, an antenna 58 is connected to the radio device 10.

Furthermore, as well as converting a baseband signal (a digital signal), which has been input from the radio control device through the optical cable 42, to a radio signal (an RF signal or an analog signal) and outputting the radio signal to the antenna 58, the radio device 10 converts a radio signal received through the antenna 58 to a baseband signal and outputs the baseband signal to the radio control device through the optical cable 42, for example. Hereinafter, a configuration of the radio device 10 will be described in detail.

Figure 2:
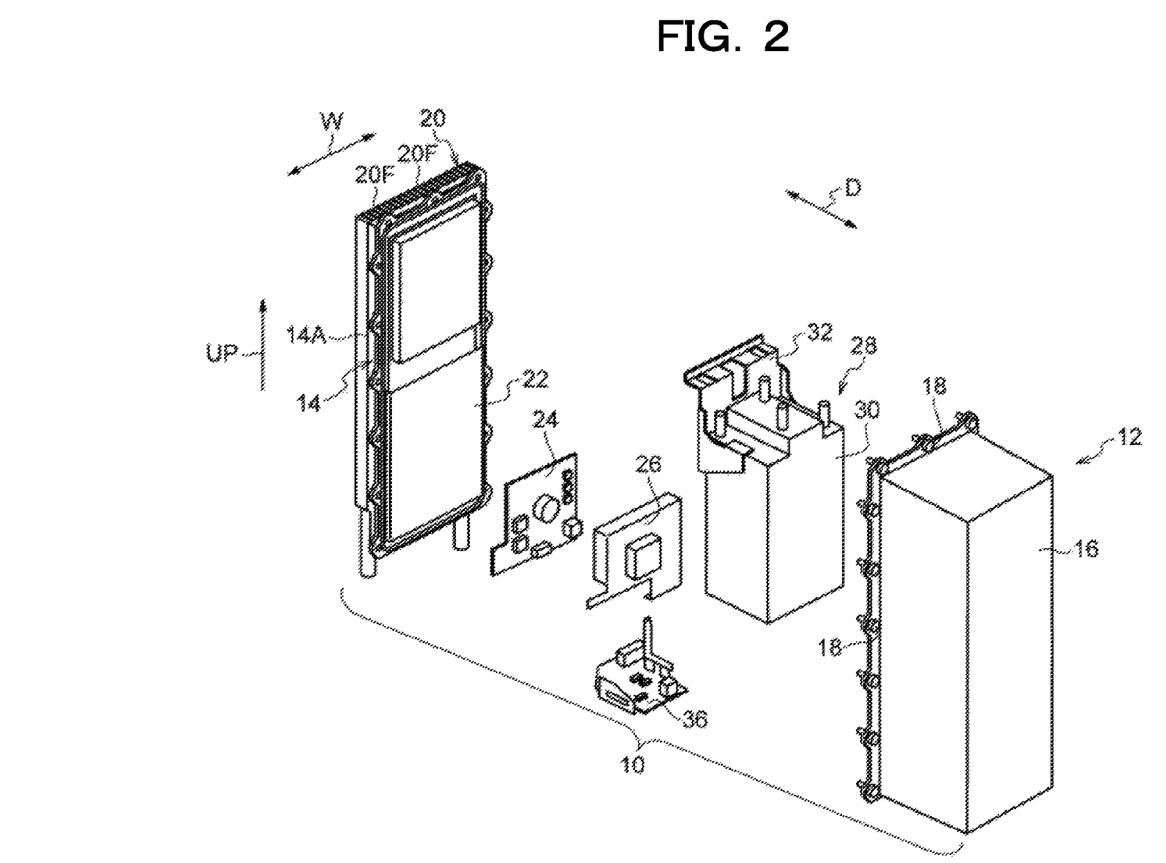
FIG. 2 is an exploded perspective view of the radio device illustrated in FIG. 1.

As illustrated in FIG. 2, the radio device 10 includes a housing 12, a board 22, a power source board 24, a shield cover 26, and an indicator 36. Note that arrow UP illustrated in each drawing as appropriate indicates the upper side in the height direction (in the up-down direction) of the radio device 10 (the housing 12). Furthermore, arrow D indicates the depth direction of the radio device 10 (the housing 12). Furthermore, arrow W indicates the width direction of the radio device 10 (the housing 12).

In a broad way, the housing 12 is formed in a rectangular parallelepiped shape in which the longitudinal direction is the height direction (the arrow UP direction). The housing 12 includes a body case 14 and a cover case 16 that are separated in the depth direction (the arrow D direction). The cover case 16 is formed of, for example, resin or the like. The cover case 16 is formed in a box shape having an opening on the body case 14 side.

Meanwhile, the body case 14 is formed of metal or the like that is thermally conductive. The body case 14 is formed in a tabular shape that closes the opening of the cover case 16. The cover case 16 and the body case 14 are joined to each other with screws 18. Furthermore, the cover case 16 and the body case 14 are hermetically sealed through a waterproofing seal material or the like.

A radiation member 20 that extends in the height direction of the housing 12 is provided on an external surface 14A of the body case 14 that is on the other side with respect to the cover case 16. The radiation member 20 includes a plurality of radiation fins 20F that increase the surface area of the radiation member 20. The plurality of radiation fins 20F are formed on the external surface 14A of the body case 14 in a rib-shape extending in the height direction of the housing 12 and are also formed so as to be integral with the housing 12 across the lower end side of the housing 12 in the height direction and the upper end side thereof. Furthermore, the plurality of radiation fins 20F are disposed so as to be spaced apart in the width direction of the housing 12.

The board 22 is attached on an internal surface of the body case 14 on the cover case 16 side. The board 22 is a control board (a main board) on which a CPU, a memory, a plurality of electronic components 60A (see FIG. 4) described later, and the like are mounted. The board 22 is formed in a rectangular tabular shape in which the longitudinal direction is the height direction of the housing 12 and is disposed so as to extend in the height direction of the housing 12.

Figure 3:
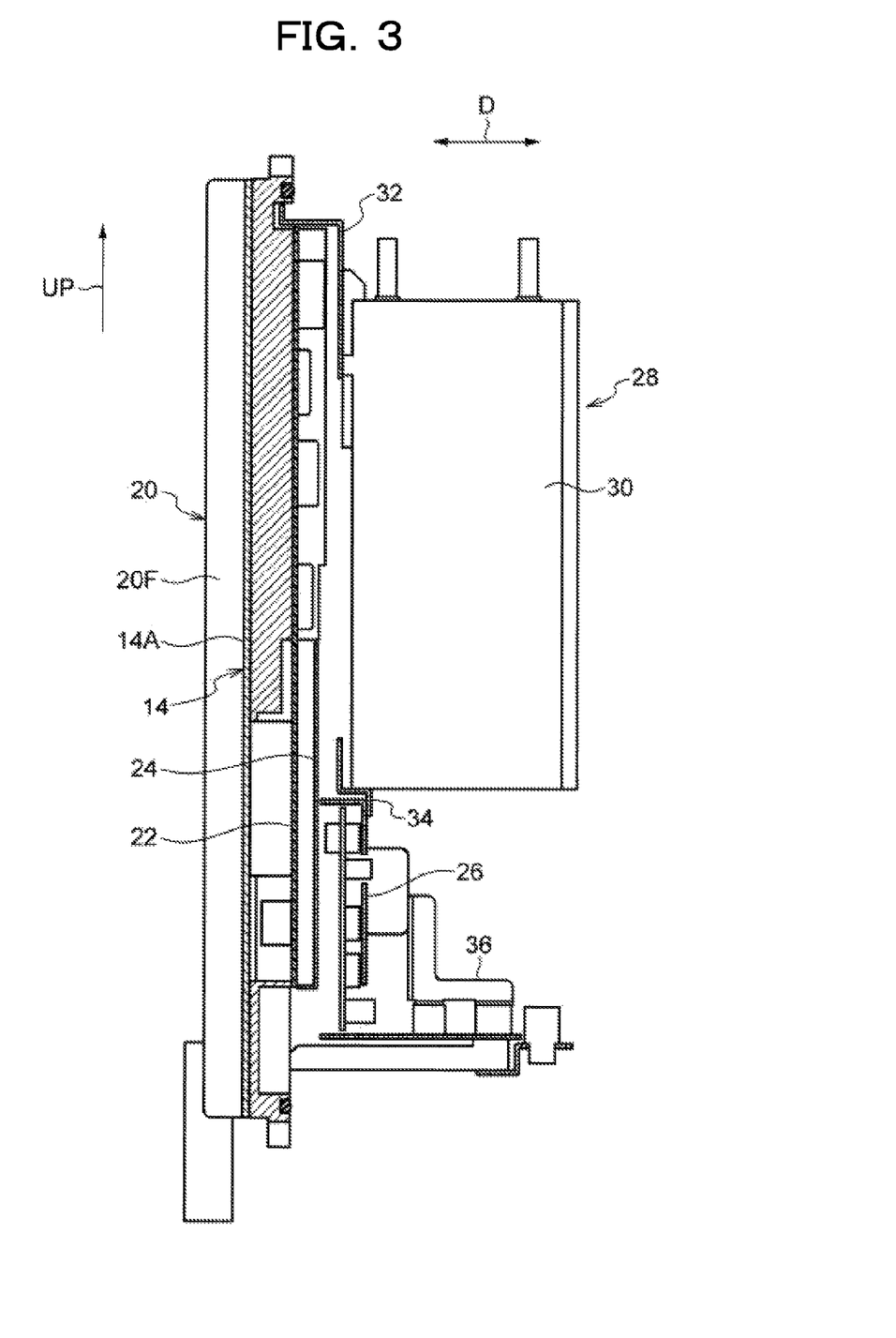
FIG. 3 is a longitudinal section of the radio device illustrated in FIG. 1.

As illustrated in FIG. 3, the board 22 is fixed to the body case 14 with screws (not shown) or the like while opposing the internal surface of the body case 14. Furthermore, the board 22 is connected to the radiation member 20 through the body case 14 so as to be capable of exchanging heat. With the above, the heat generated by the electronic components 60A and the like that are mounted on the board 22 is released (radiated) to the outside of the housing 12 from the radiation member 20 through the board 22 and the body case 14.

The power source board 24 is attached to a lower portion of the board 22. The power source board 24 is a control board that controls electric power supplied from a power source (not shown). The power source board 24 is disposed on the lower portion of the board 22 on an opposite side with respect to the body case 14 and is attached to the board 22 with screws (not shown) or the like while opposing the board 22. Note that in the present exemplary embodiment, although the board 22 and the power source board 24 are separate components, the board 22 and the power source board 24 may be an integral component.

The shield cover 26 is disposed on the side of the board 22 that is opposite to the power source board 24. The shield cover 26 is a metal cover member that shields a radio wave. The shield cover 26 is attached to the body case 14 with screws (not shown) or the like while covering the power source board 24 from the cover case 16 side.

A built-in unit 28 is attached to an upper portion of the body case 14. In a broad way, the built-in unit 28 is formed in a rectangular parallelepiped shape in which the longitudinal direction is the height direction of the housing 12. The built-in unit 28 includes a filter unit 54 and a unit housing 30 that accommodates the filter unit 54, which are described later.

An upper portion of the unit housing 30 is attached to the body case 14 through an upper bracket 32, and a lower portion thereof is attached to the power source board 24 and the body case 14 through a lower bracket 34.

Figure 4:
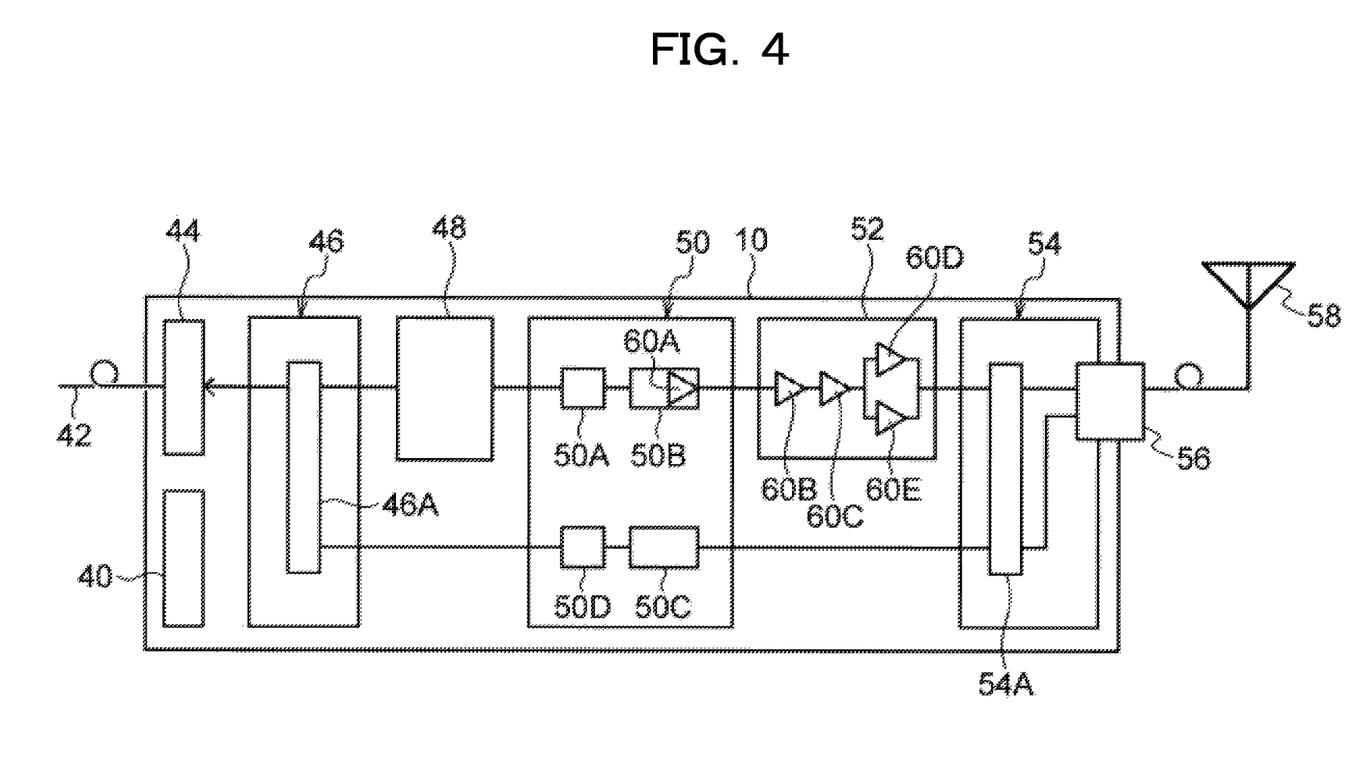
FIG. 4 is a block diagram illustrating a function of the radio device illustrated in FIG. 1.

Referring next to the functional blocks illustrated in FIG. 4, various functions of the radio device 10 will be described.

The radio device 10 includes a power source control unit 40, a common public radio interface (CPRI) unit 46, a distortion compensation processing unit (a distorter or a transmitter) 48, converter units (converters) 50, amplifier units (amplifiers) 52, and the filter unit 54.

The power source control unit 40 controls the electric power supplied from the power source (not shown) and supplies the electric power to the board 22 and the built-in unit 28. The CPRI unit 46 is connected to the radio control devices such as the BBU described above through the optical cable 42 and an optical module 44. The CPRI unit 46 is a protocol interface with the radio control device and, in accordance with a protocol, performs processing on the signals transmitted to and received from the radio control device. Furthermore, the CPRI unit 46 includes a transmission/reception separating unit 46A that separates the digital signal input from the radio control device and the digital signal that is output to the radio control device from each other.

The distortion compensation processing unit 48 performs distortion compensation on the digital signal input from the CPRI unit 46 and outputs the signal to the converter units 50. Each converter unit 50 includes a D/A converter 50A, a transmission frequency converter 50B, a reception frequency converter 50C, and an A/D converter 50D.

Each D/A converter 50A converts the digital signal input from the CPRI unit 46 to an analog signal and outputs the analog signal to the corresponding transmission frequency converter 50B. Each transmission frequency converter 50B converts the frequency and the like of the analog signal input from the corresponding D/A converter 50A and outputs the analog signal to the corresponding amplifier unit 52. Note that each transmission frequency converter 50B includes, for example, the electronic components 60A such as an amplifier (a power amplifier) that amplifies the analog signal that is output to the corresponding amplifier unit 52.

Each amplifier unit 52 further amplifies the analog signal input from the corresponding converter unit 50 and outputs the analog signal to the filter unit 54. Each amplifier unit 52 includes, for example, a plurality of (four in the present exemplary embodiment) electronic components 60B, 60C, 60D, and 60E such as an amplifier (a power amplifier) that amplifies the analog signal output to the filter unit 54. Note that in the following description, the electronic components 60A, 60B, 60C, 60D, and 60E are collectively referred to as electronic components 60. Furthermore, the electronic components 60 are an example of heat generating components that generate heat by consuming electric power.

For example, the filter unit 54 limits the analog signals input from the converter units 50 to a predetermined frequency band and outputs the analog signals to the antenna 58 through an antenna connector 56. Meanwhile, the analog signals received by the antenna 58 are output to the filter unit 54 through the antenna connector 56. The filter unit 54 includes a transmission/reception separating unit 54A. Then, the analog signals input from the antenna 58 are separated, with the transmission/reception separating unit 54A, from the analog signals input from the amplifier unit 52 and are output to the reception frequency converter 50C of the converter unit 50.

The reception frequency converter 50C converts the frequency of the analog signals input from the filter unit 54 and outputs the analog signals to the A/D converter 50D. Each A/D converter 50D converts the analog signal input from the corresponding reception frequency converter 50C to a digital signal and outputs the digital signal to the CPRI unit 46.

The digital signals input to the CPRI unit 46 from the A/D converters 50D are separated, with the transmission/reception separating unit 46A, from the digital signals input from the optical module 44 and are output to the radio control device through the optical module 44.

Note that the amount of heat generated by the electronic components (the heat generating components) 60 of the converter units 50 and the amplifier units 52 is larger than the amount of heat generated by the electronic components (not shown) of the CPRI unit 46 and the distortion compensation processing unit 48. Accordingly, the converter units 50 and the amplifier units 52 are high-heat resistance units in which the heat resistance temperatures of the electronic components 60 are higher than the heat resistance temperatures of the electronic components (not shown) of the CPRI unit 46 and the distortion compensation processing unit 48. In other words, the CPRI unit 46 and the distortion compensation processing unit 48 are low-heat resistance units in which the heat resistance temperatures of the electronic components are lower than the heat resistance temperatures of the electronic components 60 of the converter units 50 and the amplifier units 52.

Figure 5:
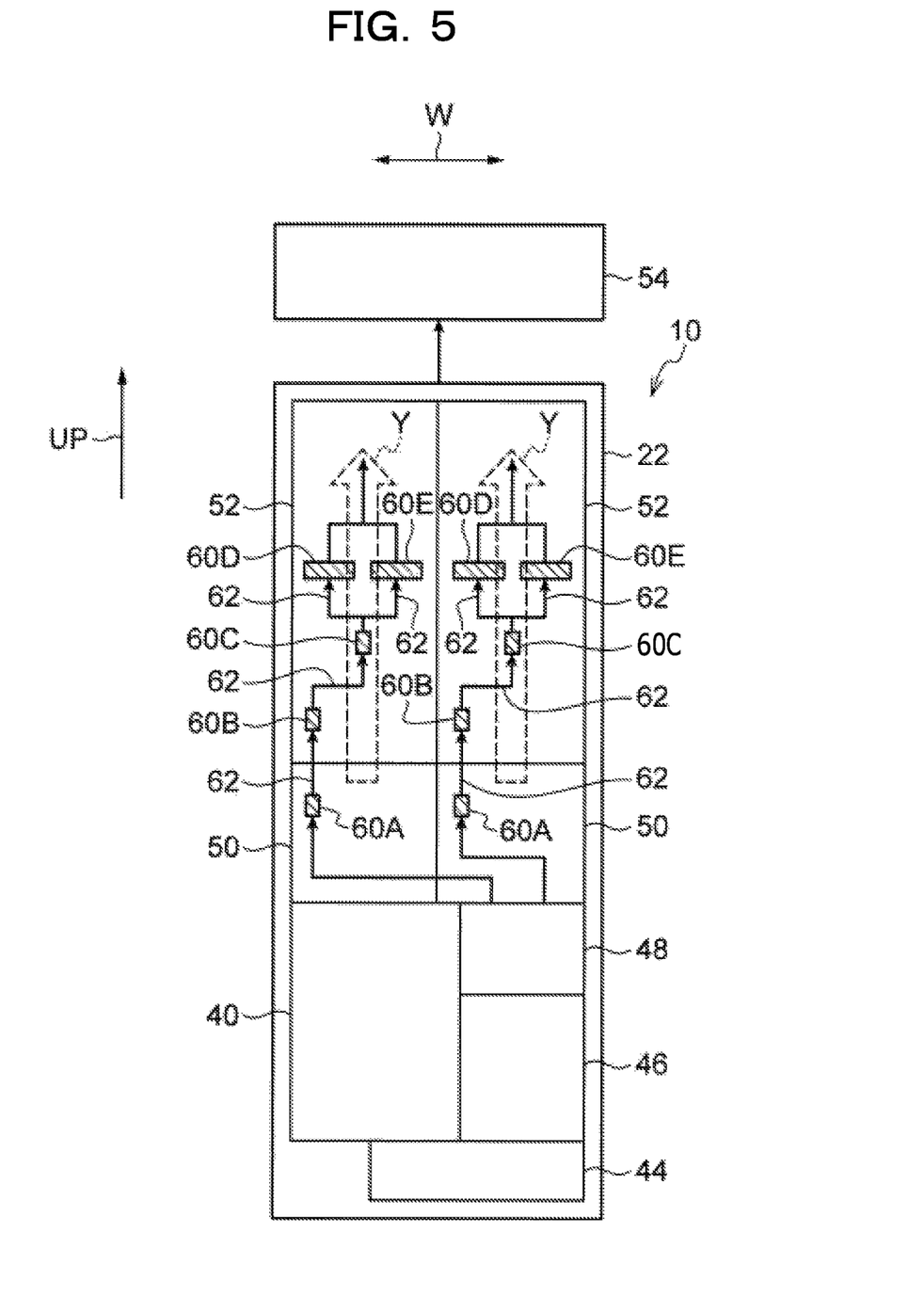
FIG. 5 is a front view of a board illustrated in FIG. 2 viewed from a body case side.

Furthermore, air inside the housing 12 that has been heated by the CPRI unit 46, the distortion compensation processing unit 48, the electronic components 60 of the converter units 50 and the amplifier units 52, and the like moves to the upper portion of the housing 12 as illustrated by arrows Y in FIG. 5. Accordingly, in the housing 12, the upper portion tends to become higher in temperature than the temperature of the lower portion.

Accordingly, as illustrated in FIG. 5, in the present exemplary embodiment, the converter units 50 and the amplifier units 52 that are high-heat resistance units are mounted on the upper portion (the upper area) of the board 22, and the CPRI unit 46 and the distortion compensation processing unit 48 that are low-heat resistance units are mounted on the lower portion (the lower area) of the board 22. In other words, the CPRI unit 46 and the distortion compensation processing unit 48 that are low-heat resistance units are disposed on the lower side of the housing 12 in the height direction with respect to the converter units 50 and the amplifier units 52 that are high-heat resistance units.

More specifically, the amplifier units 52, the converter units 50, the distortion compensation processing unit 48, and the CPRI unit 46 are mounted on the board 22 in the order of, from the upper side of the housing 12 in the height direction, the amplifier units 52, the converter units 50, the distortion compensation processing unit 48, and the CPRI unit 46. With the above, influence of heat on the distortion compensation processing unit 48 and the CPRI unit 46, which are low-heat resistance units, is reduced.

Note that the radio device 10 according to the present exemplary embodiment includes two pairs of converter units 50 and amplifier units 52 that share the CPRI unit 46 and the distortion compensation processing unit 48. The two pairs of converter units 50 and amplifier units 52 have similar configurations and are disposed so as to be arranged in the width direction (the arrow W direction) of the board 22. Note that the number of converter units 50 and the number of amplifier units 52 may be appropriately changed.

Furthermore, the plurality of electronic components 60A, 60B, 60C, and 60D of the converter units 50 and the amplifier units 52 are arranged along the radiation member 20 (see FIG. 3) in the height direction of the housing 12. In a similar manner, the electronic components 60A, 60B, 60C, and 60E are arranged along the radiation member 20 (see FIG. 3) in the height direction of the housing 12. Furthermore, the electronic components 60A and 60B, the electronic components 60B and 60C, the electronic components 60C and 60D, and the electronic components 60C and 60E that are adjacent to each other in the height direction of the housing 12 are connected to each other in the height direction of the housing 12 through wiring 62. Note that the wiring 62 is, for example, a printed circuit or the like that is printed on the board 22.

Figure 6:
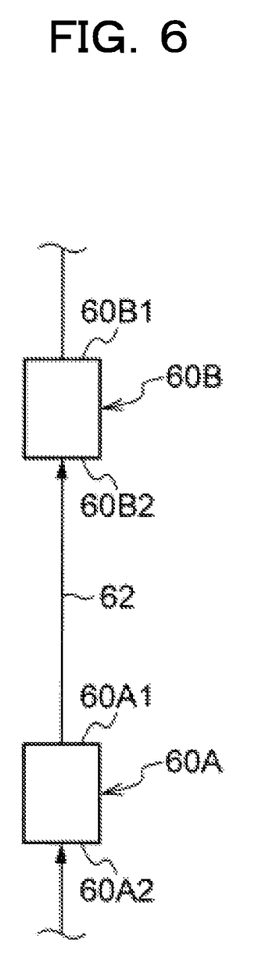
FIG. 6 is a partially enlarged view of FIG. 5.

More specifically, as illustrated in FIG. 6, the electronic components 60A and 60B that are adjacent to each other in the height direction of the housing 12 includes, although not shown, electrodes at upper end portions 60A1 and 60B1, respectively, and electrodes at lower end portions 60A2 and 60B2, respectively, in which the upper and lower end portions are two end portions of the electronic components 60A and 60B in the height direction of the housing 12, for example. Furthermore, the upper end portion 60A1 of the electronic component 60A on the lower side and the lower end portion 60B2 of the electronic component 60B on the upper side are connected to each other through the wiring 62 extending in the height direction of the housing 12. With the above, the signal paths of the electronic components 60 that are formed by the wiring 62 are formed, in a broad way, in the height direction of the housing 12.

Note that the wiring 62 is an example of a piece of wiring. Furthermore, "the plurality of electronic components arranged in the height direction of the housing" described herein denotes that the plurality of electronic components 60 are not arranged in the width direction of the housing 12 as is the case of a radio device 100 according to a comparative example described later. Accordingly, not limited to a case in which the plurality of electronic components 60 are arranged on a straight line extending in the height direction of the housing 12, the plurality of electronic components 60 may be disposed while being displaced in the width direction of the housing 12 as long as, in a broad way, the plurality of electronic components 60 are arranged in the height direction of the housing 12.

Furthermore, "the electronic components adjacent to each other in the height direction of the housing are connected in the height direction of the housing through the wiring" described herein denotes that the adjacent electronic components 60 are not connected in the width direction of the housing 12 as is the case of the radio device 100 according to the comparative example described later. Accordingly, the electronic components 60 that are adjacent to each other in the height direction of the housing 12 may be connected by wiring that is bent in a crank shape or by curved wiring as long as, in a broad way, the electronic components 60 that are adjacent to each other are arranged in the height direction of the housing 12. Note that in the present exemplary embodiment, the wiring 62 connecting each electronic component 60A and the corresponding electronic component 60B extends in a straight line and in the height direction of the housing 12.

Effects of the first exemplary embodiment will be described next.

According to the present exemplary embodiment, the radiation member 20 is provided in the height direction of the housing 12 and on the external surface 14A of the body case 14 that constitutes the housing 12 of the radio device 10. Furthermore, the board 22 is accommodated inside the housing 12 and in the height direction of the housing 12. The board 22 is capable of exchanging heat with the radiation member 20 through the body case 14.

With the above, the heat generated by the electronic components 60 and the like that are mounted on the board 22 is radiated to the outside of the housing 12 through the board 22, the body case 14, and the radiation member 20. Accordingly, rise in temperature of the electronic components 60 is alleviated and, consequently, damage and the like of the electronic components 60 and the like are suppressed.

Due to, for example, limitations in the insulation space and the like of the radio base station, reduction in size of the radio device 10 is in demand. However, when the size of the radio device 10 is reduced, the size of the radiation member 20 is also reduced. Accordingly, the amount of heat radiated from the inside of the housing 12 to the outside of the housing 12 through the radiation member 20 decreases. Accordingly, for example, in a case in which the total amount of heat generated by the plurality of electronic components 60 and the like are the same before and after the miniaturization of the radio device 10, the temperature rises more easily inside the housing 12 of the radio device 10 after miniaturization and, consequently, the electronic components 60 and the like become damaged more easily.

Conversely, in the present exemplary embodiment, the housing 12 of the radio device 10 is formed in a rectangular parallelepiped shape in which the longitudinal direction is the height direction. With the above, compared with, for example, a case in which the housing 12 is formed in a rectangular parallelepiped shape in which the longitudinal direction is the width direction, in the present exemplary embodiment, the moving path (the arrows Y in FIG. 5) of the air inside the housing 12 moving in the height direction inside the housing 12 while exchanging heat which the radiation member 20 (see FIG. 3) is long. Accordingly, the efficiency of heat radiated from the inside of the housing 12 to the outside of the housing 12 through the radiation member 20 is improved.

As described above, in the present exemplary embodiment, while reducing the size of the radio device 10 in the width direction, the efficiency of heat, which is generated inside the housing 12 by the electronic components 60 and the like, radiated to the outside of the housing 12 through the radiation member 20 may be increased.

Furthermore, as illustrated in FIG. 5, in the present exemplary embodiment, the distortion compensation processing unit 48 and the CPRI unit 46 that are low-heat resistance units are disposed on the lower side with respect to the converter units 50 and the amplifier units 52 that are high-heat resistance units. With the above, the damage and the like of the electronic components in the distortion compensation processing unit 48 and the CPRI unit 46 are suppressed in a rational manner.

Furthermore, in the present exemplary embodiment, the electronic components 60A, 60B, 60C, and 60D and the electronic components 60A, 60B, 60C, and 60E of the converter units 50 and the amplifier units 52 are arranged in the height direction of the housing 12 along the radiation member 20. Furthermore, the electronic components 60 that are adjacent to each other in the height direction of the housing 12 are connected in the height direction of the housing 12 through the wiring 62. With the above, while shortening the length of the wiring 62, the efficiency of heat radiated from the inside of the housing 12 to the outside of the housing 12 through the radiation member 20 may be improved.

Furthermore, in the present exemplary embodiment, the optical module 44 is disposed on the lower end side of the board 22. In other words, the optical module 44 is disposed on the lower end side of the unit housing 30. With the above, the optical module 44 whose heat resistance temperature is low may be set apart from the converter units 50 and the amplifier units 52 whose amount of heat generation is high. Accordingly, damage and the like of the optical module 44 are suppressed. Furthermore, connecting operation of the optical cable 42 to the optical module 44 and wiring of the optical cable 42 are facilitated. Note that the optical module 44 is an example of a low-heat resistance unit.

Figure 7:
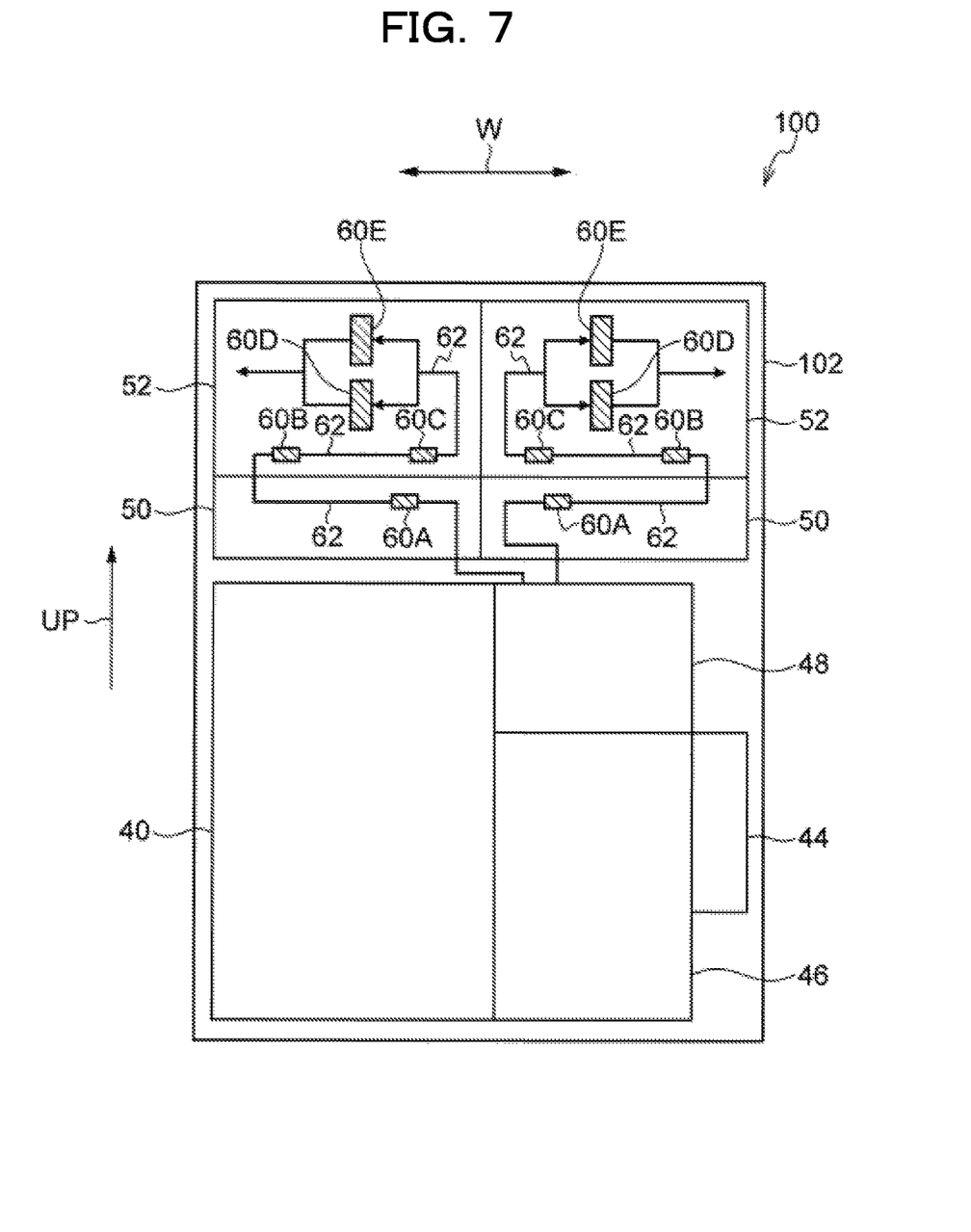
FIG. 7 is a front view of a board of an electronic device according to a comparative example corresponding to FIG. 4.

The radio device 100 according to a comparative example will be described next. As illustrated in FIG. 7, the radio device 100 (a housing) according to the comparative example is lower in height and is wider in width than the radio device 10 (the housing 12) according to the present exemplary embodiment. Due to the above, a board 102 of the radio device 100 according to the comparative example is lower in height and is wider in width than the board 22 of the radio device 10 according to the present exemplary embodiment.

In the above case, in the radio device 100 according to the comparative example, a moving path of the air moving inside the housing (not shown) in the height direction becomes shorter than that of the radio device 10 according to the present exemplary embodiment. Accordingly, compared with the radio device 10 according to the present exemplary embodiment, the amount of heat radiated to the outside of the housing 12 from the inside of the housing 12 through the radiation member 20 is decreased in the radio device 100 according to the comparative example.

Furthermore, compared with the radio device 10 according to the present exemplary embodiment, the mounting space of the electronic components 60 and the like in the height direction of the board 102 is smaller in the radio device 100 according to the competitive example. Accordingly, in the converter units 50 and the amplifier units 52 of the radio device 100, for example, the two electronic components 60B and 60C are arranged in the width direction (arrow W direction) of the board 102 and are connected to each other through wiring 62 that linearly extends in the width direction of the board 102. Accordingly, the length of the wiring 62 is long in the radio device 100 according to the comparative example.

Conversely, in the present exemplary embodiment, as described above, while reducing the size of the radio device 10 in the width direction of the housing 12 (the board 22), the efficiency of heat radiated from the inside of the housing 12 to the outside of the housing 12 through the radiation member 20 may be improved.

Figure 8:
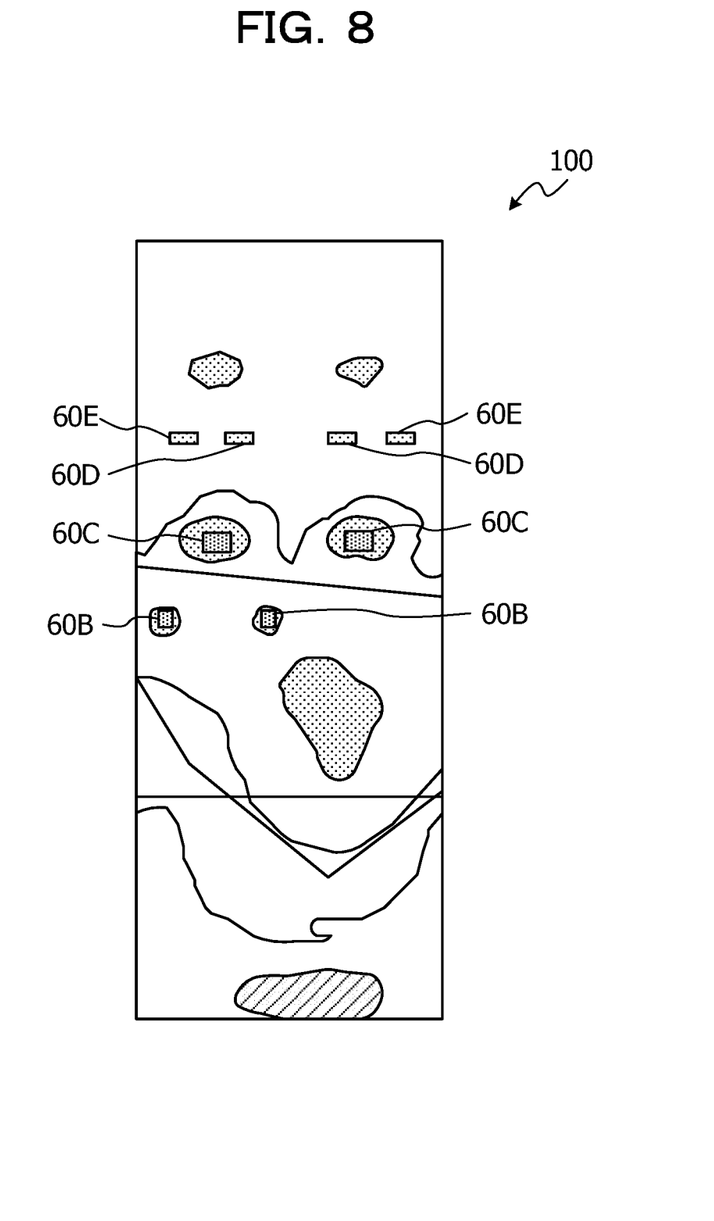
FIG. 8 is a temperature distribution of the board illustrated in FIG. 5 obtained through simulation.
Figure 9:
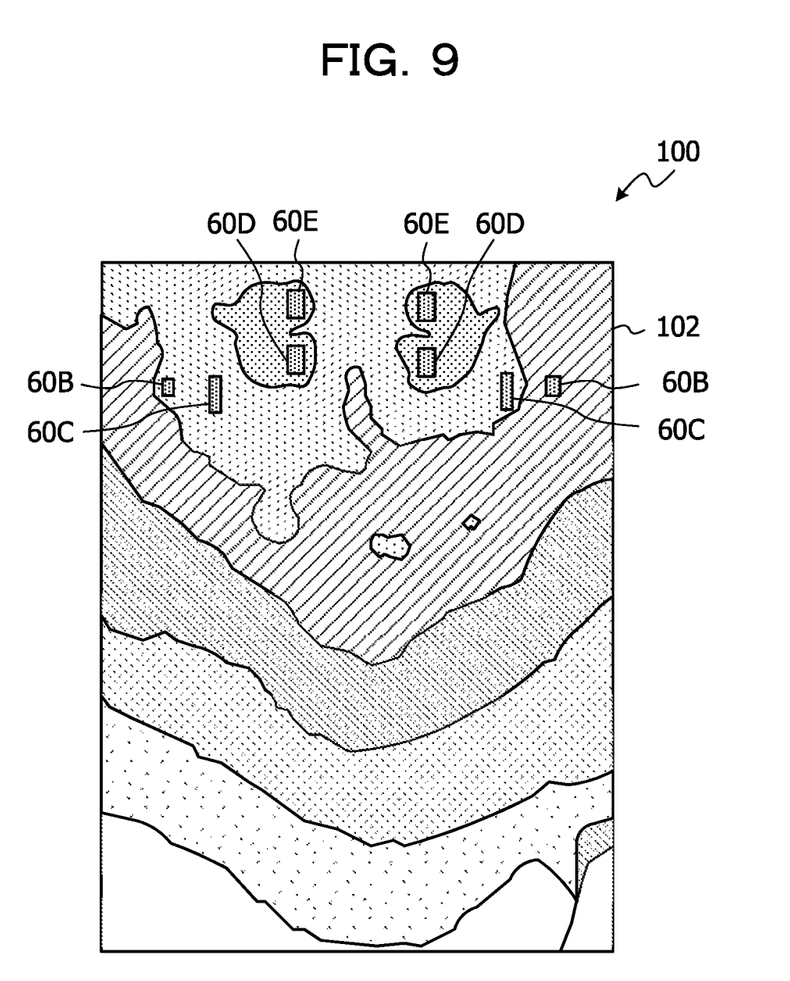
FIG. 9 is a temperature distribution of the board illustrated in FIG. 7 obtained through simulation.

Furthermore, FIG. 8 illustrates a temperature distribution in the board 22 of the radio device 10 according to the present exemplary embodiment obtained through simulation. On the other hand, FIG. 9 illustrates a temperature distribution in the board 102 of the radio device 100 according to the comparative example obtained through simulation. As illustrated in FIGS. 8 and 9, the temperature of the upper portion of the housing 12 in the radio device 10 according to the present exemplary embodiment was lower than that in the radio device 100 according to the comparative example. Note that in FIGS. 8 and 9, as the colors of the boards 22 and 102 becomes lighter, the temperature becomes lower, and as the colors of the boards 22 and 102 becomes deeper, the temperature becomes higher.

A description of a second exemplary embodiment will be given next. Note that members and the like that are similar to those of the first exemplary embodiment are denoted with the same reference numerals as those of the first exemplary embodiment and detailed descriptions thereof are appropriately omitted.

Figure 10:
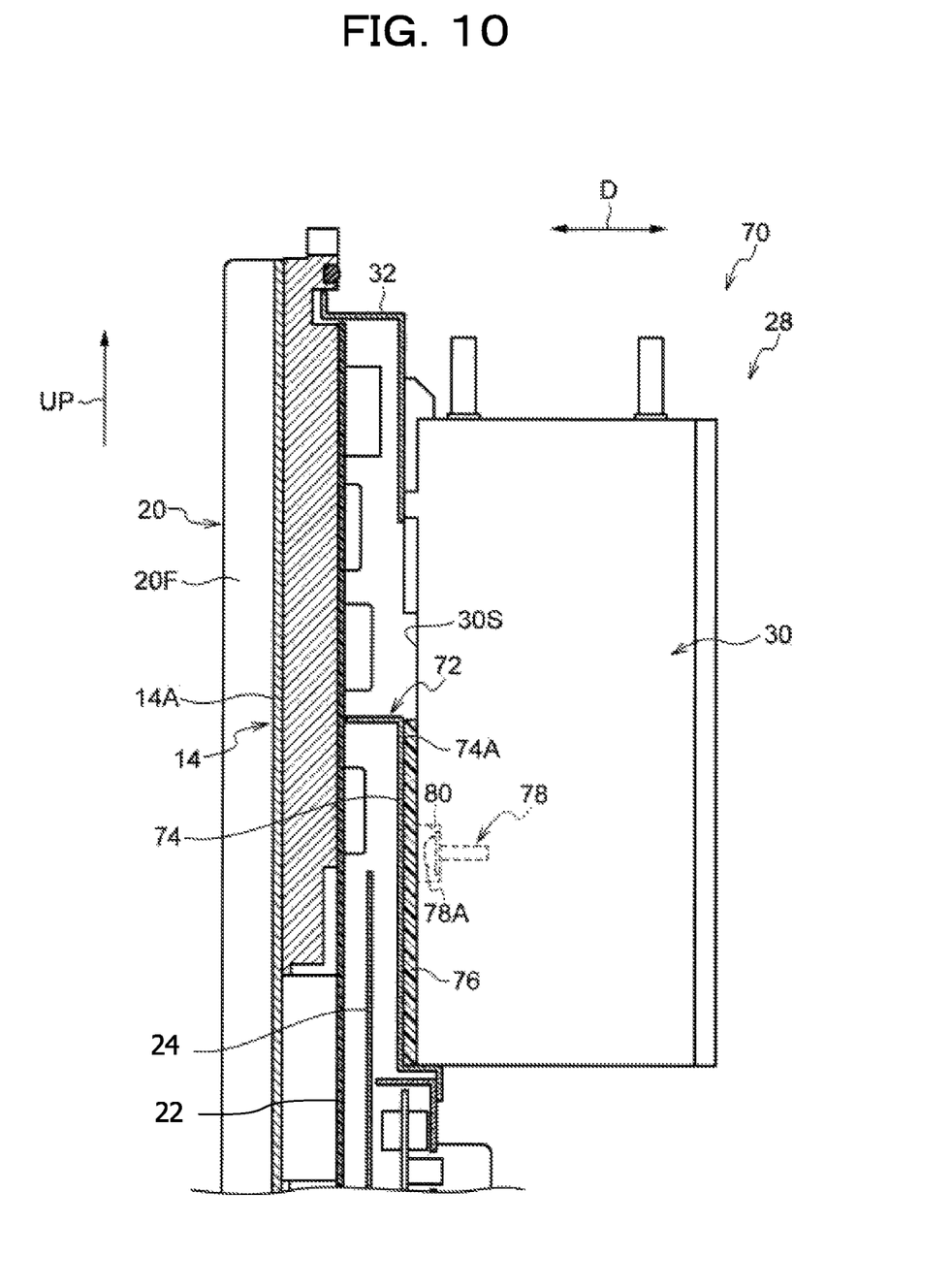
FIG. 10 is a longitudinal section of a radio device according to a second exemplary embodiment.

As illustrated in FIG. 10, in a radio device 70 according to the second exemplary embodiment, the built-in unit 28 is attached to a shield cover 72.

Specifically, the shield cover 72 is attached to the body case 14 with screws (not shown) and the like while covering the board 22 and the power source board 24. With the above, the shield cover 72 is capable of exchanging heat with the radiation member 20 through the body case 14. Note that the shield cover 72 may be attached to the board 22. In such a case, the shield cover 72 is capable of exchanging the with the radiation member 20 through the board 22 and the body case 14.

The shield cover 72 includes an opposing wall portion 74 that opposes the board 22 and the power source board 24. A surface of the opposing wall portion 74 on the opposite side with respect to the board 22 and the power source board 24 is an attaching surface 74A to which a lateral side 30S of the built-in unit 28 (the unit housing 30) is attached through a thermally-conductive sheet 76.

The thermally-conductive sheet (a heat radiation sheet) 76 is formed in a sheet shape with silicon or the like that has high thermal conductivity. The thermally-conductive sheet 76 is disposed between the attaching surface 74A of the shield cover 72 and the lateral side 30S of the built-in unit 28. With the above, the lateral side 30S of the built-in unit 28 is adhered to the attaching surface 74A of the shield cover 72.

An adjustment screw member 78 that adjusts the setting of the filter unit 54 inside the built-in unit 28 is provided in the lateral side 30S of the built-in unit 28 on the board 22 side. The adjustment screw member 78 includes a head 78A to which a tool such as a screwdriver is engaged, and the adjustment screw member 78 is inserted into an attachment hole formed in the lateral side 30S of the built-in unit 28. The setting of the filter unit 54 is changed by rotating the adjustment screw member 78 with a tool such as a screwdriver.

Furthermore, a recess 80 in which the head 78A of the adjustment screw member 78 is accommodated is formed in the lateral side 30S of the built-in unit 28. The entire head 78A of the adjustment screw member 78 is accommodated in the recess 80. With the above, the head 78A of the adjustment screw member 78 is positioned not so as to interfere with the attaching surface 74A of the shield cover 72.

Effects of the second exemplary embodiment will be described next.

In the radio device 70 according to the second exemplary embodiment, the built-in unit 28 is attached to the body case 14 through the shield cover 72. With the above, the heat of the built-in unit 28 is radiated from the radiation member 20 to the outside of the housing 12 through the shield cover 72 and the body case 14. Accordingly, the rise in temperature of the built-in unit 28 is alleviated and, consequently, damage and the like of the filter unit 54 are suppressed.

Furthermore, the lateral side 30S of the built-in unit 28 is adhered to the attaching surface 74A of the shield cover 72 through the thermally-conductive sheet 76. With the above, the transmission efficiency of the heat transmitted from the built-in unit 28 to the shield cover 72 is improved. Accordingly, the rise in temperature of the built-in unit 28 is alleviated further.

Furthermore, the adjustment screw member 78 is attached to the lateral side 30S of the built-in unit 28. The head 78A of the adjustment screw member 78 is accommodated in the recess 80 formed in the lateral side 30S of the built-in unit 28. With the above, the head 78A of the adjustment screw member 78 is positioned not so as to interfere with the attaching surface 74A of the shield cover 72. Accordingly, adhesion between the lateral side 30S of the built-in unit 28 and the attaching surface 74A of the shield cover 72 is secured.

As described above, in the present exemplary embodiment, the heat of the built-in unit 28 is efficiently radiated to the outside of the housing 12 from the radiation member 20 through the shield cover 72 and the body case 14. Accordingly, damage and the like of the filter unit 54 inside the built-in unit 28 are suppressed.

Furthermore, in the present exemplary embodiment, the built-in unit 28 and the radiation member 20 are connected to each other through the shield cover 72 so as to be capable of exchanging heat. With the above, compared with a case in which the built-in unit 28 and the radiation member 20 are connected to each other so as to be capable of exchanging heat through a heat conduction member that is additionally provided, the number of components may be suppressed.

Note that in the present exemplary embodiment, although heat exchange is performed between the built-in unit 28 in the radiation member 20 through the shield cover 72, heat exchange may be performed between the built-in unit 28 and the radiation member 20 through the upper bracket 32.

Furthermore, in a case in which the shield cover 72 and the built-in unit 28 are connected to each other so as to be capable of exchanging heat, the thermally-conductive sheet 76 and the recess 80 for the adjustment screw member 78 may be omitted.

Modifications of the first and second exemplary embodiments described above will be described next.

In the first and second exemplary embodiments described above, the radiation member 20 includes the plurality of radiation fins 20F; however, the shape and the like of the radiation fins 20F may be appropriately changed. Furthermore, the radiation member may be various heatsinks. Furthermore, not limited to the air-cooled radiation member, the radiation member may be a water-cooling radiation member.

Furthermore, not limited to a radio device that constitutes a portion of a portable base station, the first and second exemplary embodiments may be appropriately applied to other radio devices.

While the first and second embodiments of the technique disclosed in the present application has been described above, the technique disclosed in the present application is not limited to the above first and second exemplary embodiments. Furthermore, the above-described first and second exemplary embodiments and various modifications may be appropriately combined and may be modified without departing from the spirit and scope of the technique disclosed in the present application.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:
1. A radio device comprising:
   a housing;
   a heat sink provided on an external surface of the housing, the heat sink extending in a vertical direction of the housing;

a board accommodated inside the housing in the vertical direction, the board being coupled to the heat sink through the housing; and a plurality of electronic components provided on the board, the plurality of electronic components including at least one first electronic component and at least one second electronic component, the at least one first electronic component being more heat-resistant than the at least one second electronic component, the at least one first electronic component and the at least one second electronic component being provided on the board so that the at least one first electronic component is located above the at least one second electronic component in the vertical direction;

wherein the at least one first electronic component includes at least one amplifier and at least one convertor, and the at least one second electronic component includes at least one distorter and at least one common public radio interface (CPRI).

2. The radio device according to claim 1, wherein the plurality of electronic components is coupled to each other via a wire in the vertical direction.

3. The radio device according to claim 2, wherein each adjacent pair of the plurality of electronic components is coupled via the wire, each upper end of each lower electronic components of each adjacent pair is coupled to each lower end of each upper electronic components of each adjacent pair via the wire.

4. The radio device according to claim 1, further comprising:

an optical module coupled to an optical cable, the optical module being provided on the board below the at least one second electronic component.

5. The radio device according to claim 1, further comprising:

a shield cover accommodated inside the housing in the vertical direction, the shield cover covering over the board from an opposite direction of the heat sink, the shield cover being coupled to the heat sink through the housing; and a built-in unit accommodated inside the housing and provided on the shield cover.

6. The radio device according to claim 5, wherein the built-in unit is adhered to the shield cover through a thermally-conductive sheet.

7. The radio device according to claim 6, wherein the thermally-conductive sheet is provided between the shield cover and a side of the built-in unit.

8. The radio device according to claim 1, wherein the at least one first electronic component generates much heat than the at least one second electronic component.

9. The radio device according to claim 1, wherein the amplifier is located above the convertor in the vertical direction, and the distorter is located above the CPRI in the vertical direction.

10. The radio device according to claim 1, wherein the radio device is at least a part of a radio base station.

11. The radio device according to claim 10, wherein the radio device is remote radio head (RRH) of the radio base station.

* * * * *